United States Patent
Sandström (10) Patent No.: US 9,164,373 B2
(45) Date of Patent: Oct. 20, 2015

(54) METHOD AND DEVICE FOR WRITING PHOTOMASKS WITH REDUCED MURA ERRORS

(71) Applicant: Micronic Mydata AB, Täby (SE)

(72) Inventor: Torbjörn Sandström, Pixbo (SE)

(73) Assignee: Micronic Mydata AB, Taby (SE)

( * ) Notice: Subject to any disclaimer, the term of this patent is extended or adjusted under 35 U.S.C. 154(b) by 0 days.

(21) Appl. No.: 14/207,428

(22) Filed: Mar. 12, 2014

(65) Prior Publication Data

US 2014/0272685 A1   Sep. 18, 2014

Related U.S. Application Data

(60) Provisional application No. 61/777,978, filed on Mar. 12, 2013.

(51) Int. Cl.
| G03F 1/42 | (2012.01) |
| G03F 9/00 | (2006.01) |
| G03F 7/20 | (2006.01) |

(52) U.S. Cl.
CPC .... *G03F 1/42* (2013.01); *G03F 7/704* (2013.01); *G03F 7/70358* (2013.01); *G03F 7/70383* (2013.01); *G03F 7/70425* (2013.01); *G03F 7/70466* (2013.01); *G03F 7/70583* (2013.01); *G03F 7/70775* (2013.01); *G03F 9/708* (2013.01); *G03F 9/7011* (2013.01)

(58) Field of Classification Search
CPC . G03F 7/70466; G03F 7/70383; G03F 7/704; G03F 7/70583; G03F 7/70358; G03F 7/70425; G03F 7/70775; G03F 9/708; G03F 9/7011; G03F 1/42
USPC .......................... 430/22, 296, 942, 5
See application file for complete search history.

(56) References Cited

U.S. PATENT DOCUMENTS

| 4,131,782 A | 12/1978 | Einstein et al. |
| 4,322,260 A | 3/1982 | Conlon |
| 4,377,736 A | 3/1983 | Daunt et al. |
| 4,533,813 A | 8/1985 | Rayburn et al. |
| 4,628,179 A | 12/1986 | Crahay |
| 4,652,722 A | 3/1987 | Stone et al. |
| 4,734,746 A | 3/1988 | Ushida et al. |
| 4,758,705 A | 7/1988 | Hertzel et al. |
| 4,812,661 A | 3/1989 | Owen |
| 4,958,373 A | 9/1990 | Usami et al. |
| 4,977,458 A | 12/1990 | Granger et al. |
| 5,049,901 A | 9/1991 | Gelbart |
| 5,065,193 A | 11/1991 | Saitoh et al. |
| 5,147,680 A | 9/1992 | Slysh |
| 5,247,155 A | 9/1993 | Steen et al. |
| 5,278,385 A | 1/1994 | Gerome et al. |
| 5,296,036 A | 3/1994 | Matsuyama et al. |
| 5,315,384 A | 5/1994 | Heffington et al. |
| 5,402,155 A | 3/1995 | Hatayama et al. |
| 5,495,279 A | 2/1996 | Sandstrom et al. |
| 5,535,672 A | 7/1996 | Kuwahara |
| 5,663,783 A | 9/1997 | Ueda |
| 5,668,588 A | 9/1997 | Morizumi et al. |
| 5,868,075 A | 2/1999 | Kline et al. |
| 5,917,935 A | 6/1999 | Hawthorne et al. |
| 5,991,038 A | 11/1999 | Yamamoto et al. |
| 6,066,830 A | 5/2000 | Cline et al. |
| 6,130,405 A | 10/2000 | Loringer |
| 6,151,109 A | 11/2000 | Bromssen et al. |
| 6,154,561 A | 11/2000 | Pratt et al. |
| 6,285,488 B1 | 9/2001 | Sandstrom et al. |
| 6,489,984 B1 | 12/2002 | Johnson |
| 6,542,178 B2 | 4/2003 | Miyagawa et al. |
| 6,586,702 B2 | 7/2003 | Wiener-Avnear et al. |

(Continued)

FOREIGN PATENT DOCUMENTS

| EP | 0157546 A2 | 10/1985 |
| EP | 1132776 A2 | 9/2001 |

(Continued)

OTHER PUBLICATIONS

Tanaguchi, Kazutaka et al. A MURA Detection Method Considering Human Vision Perception, in Transactions of the Institute of ElectricalEngineers of Japan, vol. 126, No. 11, p. 1539-1548, 2006.
Video Electronics Standards Association (VESA), "Flat Panel Display Measurements Standard (FPDM)", Version 2.0 available online at http:/www.vesa.org/public/Fpdm2/FPDMUPDT.pdf. Accessed Nov. 15, 2007.
International Search Report dated Sep. 19, 2008 from corresponding International App. No. PCT/IB2008/001280.
Sandstrom et al., "Pattern Generation with SLM Imaging", 21st Annual BACUS Symposium on Photomask Technology, Gian T. Dao, Brian j. Grenon, Editors, Proceedings of SPIE vol. 4562 (2002).
International Search Report, Appl No. PCT/SE2004/0011159, Nov. 16, 2004, 2 pages.

(Continued)

*Primary Examiner* — Christopher Young
(74) *Attorney, Agent, or Firm* — Haynes Beffel & Wolfeld LLP (57) ABSTRACT

The problem of mura in large area photomasks is solved or at least reduced by setting up a writing system to write a pattern with high accuracy and with the optical axes essentially parallel to the movement axes of the stage, then writing photomasks in two passes with the substrate rotated to different angles on the stage. The angle between the orientation of the first and second pass is larger than about 10 degrees, larger than about 20 degrees or larger than about 35 degrees and it can be approximately 10 degrees, approximately 50 degrees, approximately 60 degrees or approximately 90 degrees. The substrate is physically rotated on the stage and aligned with high accuracy after the rotation and the data driving the first and second exposure passes are derived from the first input data specification but processed according to the known oblique angles, so that the second pass is accurately overlaid on the first pass.

19 Claims, 6 Drawing Sheets

(56) References Cited

U.S. PATENT DOCUMENTS

| | | |
|---|---|---|
| 6,625,181 B1 | 9/2003 | Oshemkov et al. |
| 6,717,756 B2 | 4/2004 | Berman et al. |
| 6,822,192 B1 | 11/2004 | Young |
| 7,289,137 B2 | 10/2007 | Liebig et al. |
| 7,411,651 B2 * | 8/2008 | Ostrom et al. ............ 355/53 |
| 7,806,731 B2 | 10/2010 | Takiar et al. |
| 8,102,410 B2 * | 1/2012 | Sandstrom ............. 347/234 |
| 8,160,351 B2 * | 4/2012 | Sandstrom et al. ........ 382/149 |
| RE43,509 E | 7/2012 | Asai et al. |
| 8,228,473 B2 | 7/2012 | Sawasaki et al. |
| 8,247,032 B2 | 8/2012 | Mirkin et al. |
| 8,283,192 B2 | 10/2012 | Watanabe |
| 8,361,876 B2 | 1/2013 | Ishimaru et al. |
| 8,372,564 B2 | 2/2013 | Shoki |
| 8,377,349 B2 | 2/2013 | Sato |
| 8,767,185 B2 * | 7/2014 | Sandstrom ............ 355/77 |
| 2003/0151008 A1 | 8/2003 | Yamada |
| 2003/0218667 A1 | 11/2003 | Williams et al. |
| 2004/0029024 A1 | 2/2004 | Ohnuma |
| 2004/0081499 A1 | 4/2004 | Sasaki |
| 2004/0150707 A1 | 8/2004 | Stiblert et al. |
| 2004/0213449 A1 | 10/2004 | Safaee-Rad et al. |
| 2005/0007364 A1 | 1/2005 | Oyama et al. |
| 2005/0018255 A1 | 1/2005 | Nakaya et al. |
| 2005/0052464 A1 | 3/2005 | Okuyama |
| 2005/0104953 A1 | 5/2005 | Suzuki et al. |
| 2005/0157161 A1 | 7/2005 | Fukuda |
| 2005/0220330 A1 | 10/2005 | Kobayashi et al. |
| 2005/0271262 A1 | 12/2005 | Yoshida |
| 2005/0280805 A1 | 12/2005 | Murai |
| 2006/0092199 A1 | 5/2006 | White et al. |
| 2006/0158642 A1 | 7/2006 | Tanaka |
| 2006/0158643 A1 | 7/2006 | Yoshida |
| 2006/0197826 A1 | 9/2006 | Assa et al. |
| 2006/0203246 A1 | 9/2006 | Nakajima et al. |
| 2007/0070508 A1 | 3/2007 | Ruhle et al. |
| 2007/0132828 A1 | 6/2007 | Ishida et al. |
| 2007/0182808 A1 | 8/2007 | Stiblert et al. |
| 2007/0188591 A1 | 8/2007 | Sandstrom |
| 2008/0199068 A1 | 8/2008 | Duquette et al. |
| 2009/0009842 A1 | 1/2009 | Destain et al. |
| 2010/0033698 A1 | 2/2010 | Sewell |
| 2010/0060973 A1 | 3/2010 | Olaya et al. |
| 2010/0118107 A1 | 5/2010 | Peregrym et al. |
| 2010/0141732 A1 | 6/2010 | Sasaki et al. |
| 2010/0142757 A1 | 6/2010 | Sandstrom et al. |
| 2010/0208329 A1 | 8/2010 | Sandstrom et al. |
| 2011/0242514 A1 | 10/2011 | Sandstrom |
| 2012/0140193 A1 | 6/2012 | Chiu et al. |
| 2012/0149135 A1 | 6/2012 | Sugimura et al. |
| 2012/0170240 A1 | 7/2012 | Tanaka |
| 2012/0269972 A1 | 10/2012 | Khusnatdinov et al. |
| 2012/0287357 A1 | 11/2012 | Misaki |
| 2012/0302051 A1 | 11/2012 | Matsuno et al. |
| 2012/0307226 A1 | 12/2012 | Maeda |
| 2012/0313236 A1 | 12/2012 | Wakiyama et al. |
| 2013/0001753 A1 | 1/2013 | Kanamitsu et al. |
| 2013/0017378 A1 | 1/2013 | Doytcheva et al. |

FOREIGN PATENT DOCUMENTS

| | | |
|---|---|---|
| EP | 1582928 A1 | 10/2005 |
| EP | 1645657 A1 | 4/2006 |
| JP | 60-227988 A | 11/1985 |
| JP | 0772401 A | 3/1995 |
| JP | 7101032 A | 4/1995 |
| JP | 927447 A | 1/1997 |
| JP | H10-300447 A | 11/1998 |
| JP | 2001523167 A | 11/2001 |
| JP | 2001524893 A | 12/2001 |
| JP | 2002311597 A | 10/2002 |
| JP | 2002543607 A | 12/2002 |
| JP | 2003195470 A | 7/2003 |
| JP | 2004175078 A | 6/2004 |
| JP | 2004191985 A | 7/2004 |
| JP | 2004524706 A | 8/2004 |
| JP | 2004351938 A | 12/2004 |
| JP | 200543555 | 2/2005 |
| JP | 200555524 | 3/2005 |
| JP | 2005233869 A | 9/2005 |
| JP | 4501798 B2 | 7/2010 |
| WO | 9006033 A2 | 5/1990 |
| WO | 9850196 A1 | 11/1998 |
| WO | 9852345 A1 | 11/1998 |
| WO | 0062324 A2 | 10/2000 |
| WO | 0067291 A2 | 11/2000 |
| WO | 02082598 A1 | 10/2002 |
| WO | 03081966 A2 | 10/2003 |
| WO | 2005007927 A1 | 1/2005 |
| WO | 2005013006 A1 | 2/2005 |
| WO | 2010131239 A1 | 11/2010 |

OTHER PUBLICATIONS

International Search Report and Written Opinion, Appl No. PCT/EP2011/072140, mailed Aug. 3, 2012.

Eran Elizur et al., "Printing Methods for Flat-Panel Display Manufacturing" Journal of Graphic Technology 1.2, Aug. 2003.

International Preliminary Report on Patentability dated Aug. 19, 2008 for International Application No. PCT/EP2007/001725.

U.S. Office Action from related U.S. Appl. No. 11/586,612; dated Nov. 1, 2010; 8 pgs.

U.S. Office Action from related U.S. Appl. No. 11/711,895; dated May 10, 2011; 18 pgs.

U.S. Office Action from related U.S. Appl. No. 11/586,612; dated May 3, 2011; 7 pgs.

Japanese Office Action dated Aug. 30, 2011, issued in Japanese Patent Application No. 2008-537641.

Japanese Office Action dated Aug. 30, 2011, issued in Japanese Patent Application No. 2008-537640.

U.S. Office Action from related U.S. Appl. No. 11/586,612; dated Sep. 28, 2011; 8 pgs.

U.S. Office Action from related U.S. Appl. No. 12/805,708; dated Sep. 29, 2011; 7 pgs.

* cited by examiner

Mechanical engraving

FIG. 4B

Laser marking of the surface or a film on the surface

FIG. 4C

Mechanical engraving

FIG. 4D

Deposition of particles, liquids or films on top of the surface, e.g. ink-jetting

METHOD AND DEVICE FOR WRITING PHOTOMASKS WITH REDUCED MURA ERRORS

RELATED APPLICATION

This application claims the benefit of U.S. Provisional Application No. 61/777,978, filed on 12 Mar. 2013 (MLSE 1140-1, P00406), which is hereby incorporated by reference.

This application is related to U.S. Pat. No. 8,160,351 entitled "METHOD AND APPARATUS FOR MURA DETECTION AND METROLOGY" (MLSE 1078-2, P00314) and U.S. Pat. No. 7,411,651 entitled "PSM ALIGNMENT METHOD AND DEVICE" (MLSE 1042-2, P00183). It is also related to U.S. patent application Ser. Nos. 13/314,063 entitled "CRISS-CROSS WRITING STRATEGY" (MLSE 1118-2, P00377) and 11/586,614 entitled "WRITING APPARATUSES AND METHODS" (HDP drum) by the same inventor. It also is related to U.S. Provisional Application No. 61/777,469 entitled "MECHANICALLY PRODUCED ALIGNMENT FIDUCIAL METHOD AND DEVICE" (MLSE 1138-1, P00404) by the same inventor. The related applications are incorporated by reference.

BACKGROUND

It is known that the writing of photomasks for visible displays and imaging camera devices is prone to defects called "mura", i.e. stripes and moiré patterns which come from interactions between the pattern and the writing hardware. Grid snap, small imperfections in the writing system and rasterizing artifacts may give rise to systematic errors that show up as intensity or color bands, stripes or curves in the finished product. Writing with the hardware, e.g. pixel grid and stage movements, parallel to the repeating directions of the mask pattern is considered to give predictable and reliable writing properties. However, at the same time it is prone to mura.

Figures 1A, 1B:
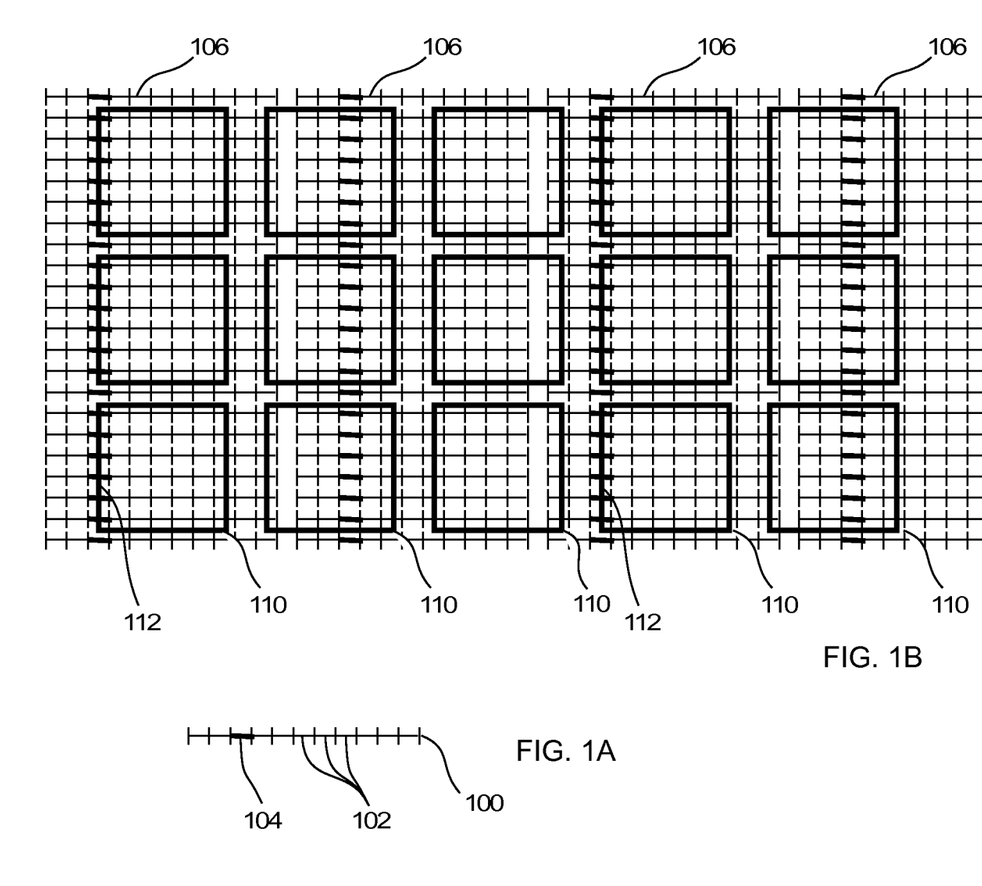
FIG. 1A shows a scan line 100 in a laser scanner with pixels 102 and a pixel 104 with a defect.
FIG. 1B shows how this defective pixel gives defective stripes 112 in a regular pattern.

In FIGS. 1A-1B, a single pixel 104 with a defect in the writing hardware may define defective stripes 114. A defective stripe 114 may define an edge 112 of a column 106 of features 110 in the mask pattern and a nearby column of features may be defined by different pixels 102 not including the single pixel 104 with a defect. If the pixels are not identical, e.g. having different exposure energy, the two columns may be visibly different. FIG. 1A shows a scan line 100 in a laser scanner with pixels 102 and a pixel 104 with a defect. FIG. 1B shows how this defective pixel gives defective stripes 114 in a regular pattern. The customary remedy is to adapt the writing so that the same pixel is used for every equivalent edge, so-called scan length adaption. There are cases when it is difficult to use this type of adaption, such as when there are features with several pitches in the mask pattern, where the features are not forming straight lines, or when the throughput loss associated with scan length adaption is unaffordable. It has been proposed by the same inventor to write the pattern obliquely by employing a writer with the hardware axes rotated relative to the stage. With writing at oblique angles multiple pixels in the writing hardware contributes to any feature edge and other edges use the same or other pixels in a less repetitive manner. Thus systematic errors are thus reduced and mura is suppressed.

In the case of a one-dimensional writing mechanism such as a laser scanner or a one-dimensional spatial light modulator there is an asymmetry between primary axis, the direction along and the secondary direction across the direction of the scan line or spatial light modulator. The same inventor has proposed writing a pattern in two passes with rotated primary axes in order to make the asymmetry between the primary and secondary axes less pronounced. See U.S. patent application Ser. No. 13/314,063 entitled "CRISS-CROSS WRITING STRATEGY" (MLSE 1118-2, P00377), incorporated by reference.

The current application teaches a practical method for reducing mura without building the system with oblique movements or an oblique writing head. The technology disclosed can therefore be used in a standard writing system with small changes and the use of the technology disclosed can be interspersed with writing operations without using it, e.g. in single pass writing.

SUMMARY

The problem of mura in large area photomasks is solved or at least reduced by setting up a writing system to write a pattern with high accuracy and with the optical axes essentially parallel to the movement axes of the stage, then writing photomasks in two passes with the substrate rotated to different angles on the stage. The angle between the orientation of the first and second pass is larger than about 10 degrees, larger than about 20 degrees or larger than about 35 degrees and it can be approximately 10 degrees, approximately 50 degrees, approximately 60 degrees or approximately 90 degrees. The substrate is physically rotated on the stage and aligned with high accuracy after the rotation and the data driving the first and second exposure passes are derived from the first input data specification but processed according to the known oblique angles, so that the second pass is accurately overlaid on the first pass.

DETAILED DESCRIPTION

Description of the technology disclosed will be made based on mechanical indentation of fiducials in the photoresist layer. Alternative embodiments based on laser ashing or ablation or deposition of a material substance (particles, ink jet drops, etc.) on the photomask substrate or the surface of the photoresist film are also possible and will be apparent. The fiducials can be formed during manufacturing of the substrate or in connection with the writing of the first pattern. What is essential is that the fiducials are formed and measured prior to the physical rotation of the substrate between the first and second writing passes.

Applying the technology disclosed, a pattern can be written with high fidelity and suppression of signatures from the writer itself. The pattern is written several times in at least two passe, with the workpiece physically rotated at least once between writing passes. Applying the technology disclosed, fiducials can be formed before the writing starts (or immediately before the rotation) and used to align the passes, accurately but with an extremely precise rotation of the passes.

Figure 2:
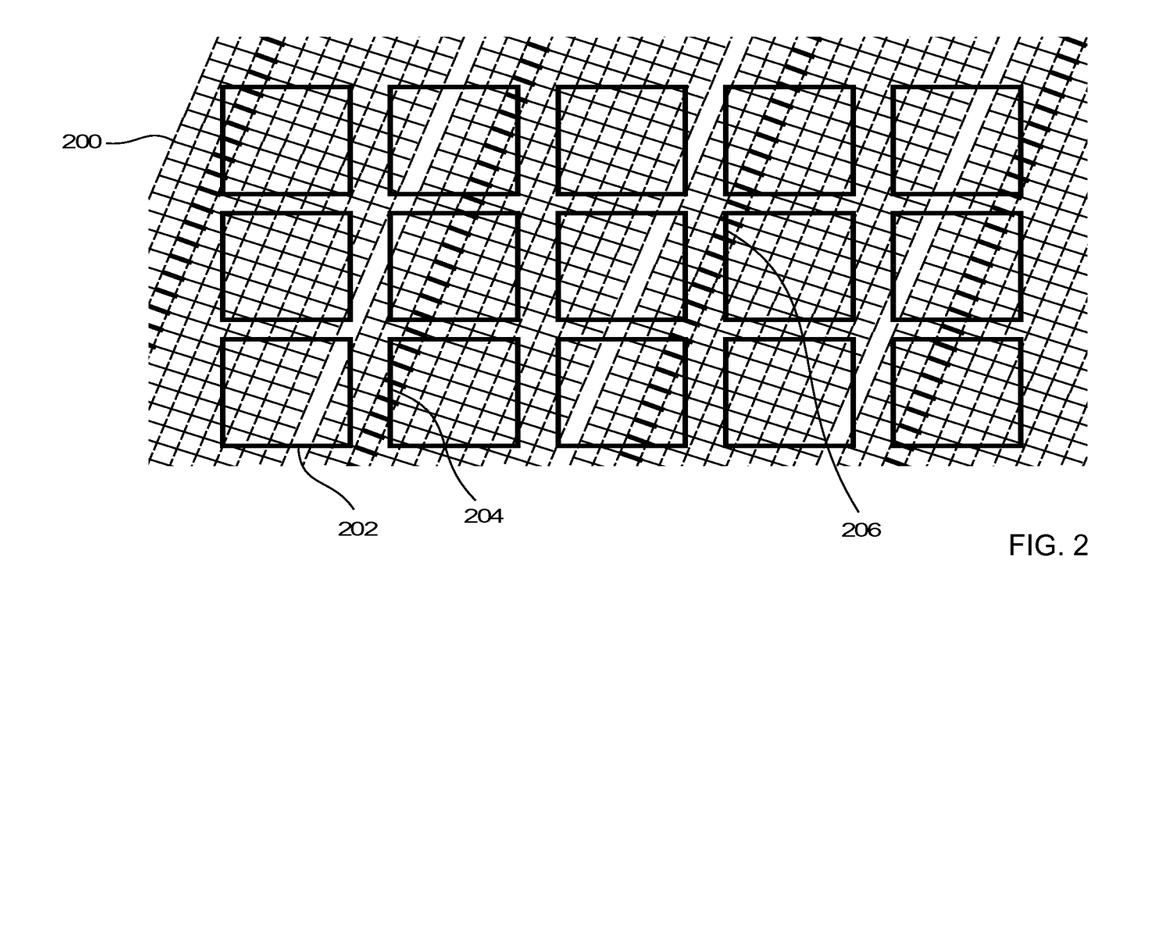
FIG. 2 shows writing at a rotation angle and how the effects of the defective pixel in FIG. 1A are dispersed in the regular pattern resulting in defective stripes 214 that do not define edges 212 of columns 206 of features 210.

FIG. 2 shows writing at a rotation angle and how the effects of the defective pixel 204 in a swath 200 are dispersed in the regular pattern resulting in defective stripes 214 that do not define edges 212 of columns 206 of features 210.

Figure 3:
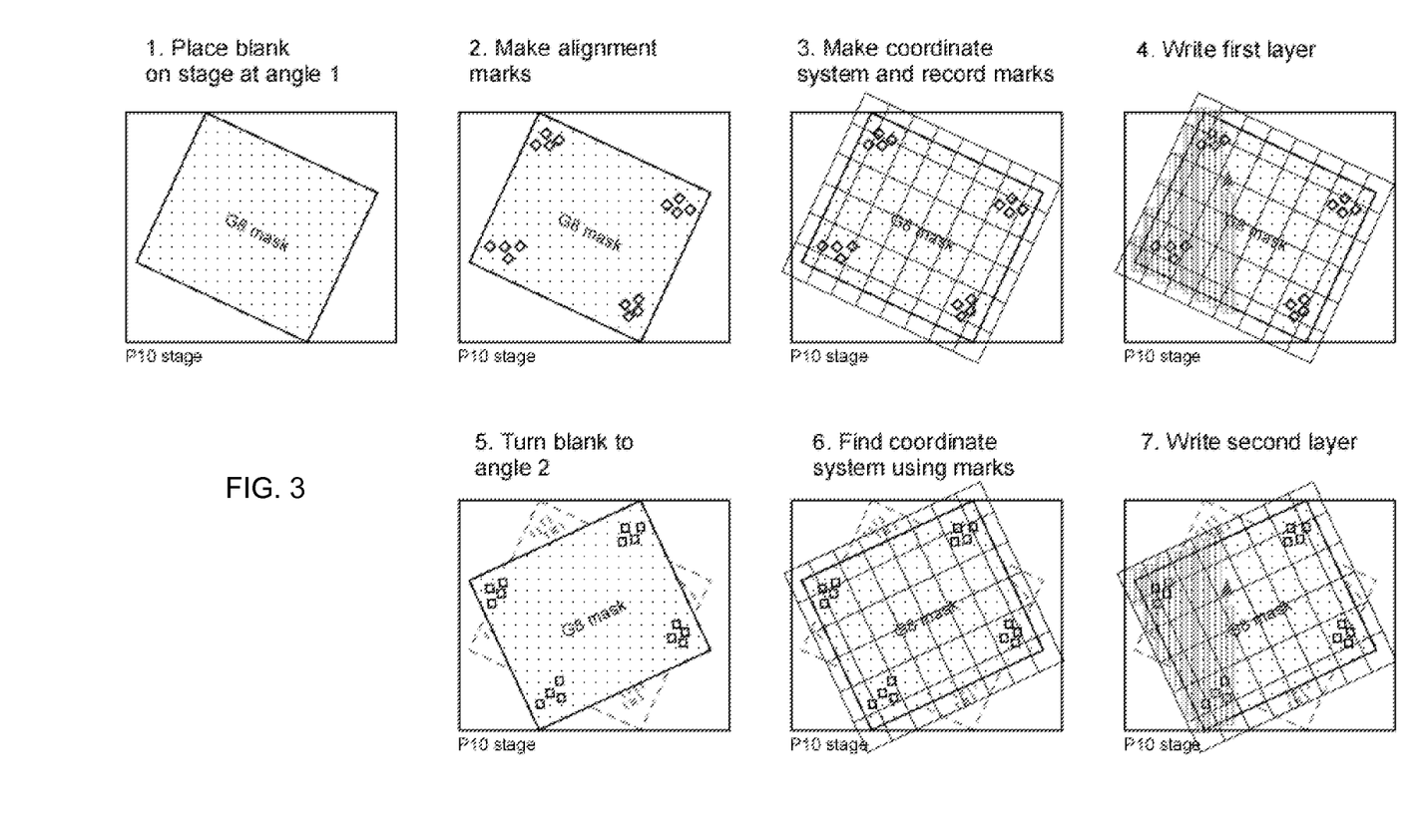
FIG. 3 shows an example procedure writing two passes with a reorientation between the passes in a writer having a larger stage than the size of the substrate which is written.

FIG. 3 shows oblique writing of a workpiece with two passes with different oblique angles. In this implementation, a mass blank is rotated to produce different oblique angles. The storyboard shows seven steps. The first step is to place a blank, such as a G8 size mask on a stage in the first oblique angle. Because the mask is placed at an angle, the stage is larger than the mask, such as a P10 stage for a G8 mask (G8 is commonly understood to mean generation 8 LCD manufacturing technology and P10 is Micronic-Mydata's writer for generation 10 photomasks). Step two is to make alignment marks on the mask. This step can be carried out, as described above, at a separate station after application of the radiation sensitive layer, or it can be carried out on the stage. Step three is to measure the position of the alignment marks and record their position relative to the first coordinate system. Note that steps two and three can follow the first exposure in step four, if precautions are taken so that the formation of the alignment marks does not upset the position of the workpiece relative to the writing coordinate system. Step five involves turning the blank to a second oblique angle.

In step six, the alignment marks are located and measured. A second coordinate system is established or the first coordinate system is reoriented to facilitate alignment of a second exposure with the first exposure. Step seven involves writing a second exposure, which may be a second exposure of the same layer as in step four.

Optically visible fiducials in or on the exposure sensitive layer can be detected without transfer and effectively used when writing a single layer with two exposures separated by a mechanical rotation of the workpiece. For instance, a pattern can be written with the workpiece placed at a first oblique angle to the desired pattern. The workpiece can be rotated in preparation for writing at a second oblique angle to the desired pattern. The optically visible fiducials in or on the exposure sensitive layer can be used to align the first and second writing passes accurately, following physical rotation of the workpiece. The workpiece on a stage can be rotated at an angle of five degrees, 10 degrees, at least 10 degrees, or 10 to 45 degrees to a primary or secondary axis of features in the desired pattern.

The two angles should be essentially symmetrical, but not necessarily exactly symmetrical. Generally speaking the method is more effective the closer to 90 degrees one can make the angle between the passes, but it may be advantageous to avoid hitting 90 degrees exactly since 45 degrees to the x and y directions is a mura-sensitive direction. It is not necessary that the two directions are symmetrical to the stage coordinate directions and it may in fact be beneficial to have a slight asymmetry, e.g. five degrees difference between the clockwise and counter-clockwise direction. Small oblique angles give less effective suppression of mura, and oblique angles larger than approximately 5 degrees, i.e. angle difference between the passes may be larger than approximately 10 degrees. The effectiveness rises and around 30 degrees oblique angle, e.g. approximately 60 degrees or at least above 50 degrees give a stronger effect. For the strongest effect the oblique angles can be above 35 degrees and the angle between the passes above approximately 70 degrees. Due to symmetry around 90 degrees the difference angle should then be between approximately 70 and 110 degrees.

The optically visible fiducials can be applied at various times after the exposure sensitive layer is applied and before the workpiece is removed from the patterning device. For instance, if mask blanks arrive at a patterning shop with resist already applied, the optically visible fiducials can be applied by the supplier of the blanks Alternatively, marks can be applied in a workstation adjacent to the patterning device immediately before the first writing pass. Or, a tool for creating the optically visible fiducials can be incorporated into the writing device, so that the fiducials are created before, during or after the first writing pass. The position of the optically visible fiducials is measured relative to the pattern written in the first writing pass. The position of the fiducials relative to the workpiece being patterned is not critical; the position relative to the pattern can readily be used for alignment between writing passes, with a mechanical reorientation in the workpiece between writing passes.

A variety of methods are available for forming optically visible fiducials by physical modification of the surface of the photoresist layer, by laser ablation, deposition of a fine pattern by dusting, spraying, ink-jetting or similar techniques, or by mechanical indentation. Mechanical indentation gives small marks with high optical contrast and is flexible since indentation can be made in the photoresist, in other polymer films and etch masks, through the photoresist into the film to be patterned, or into the substrate.

Figure 4A:
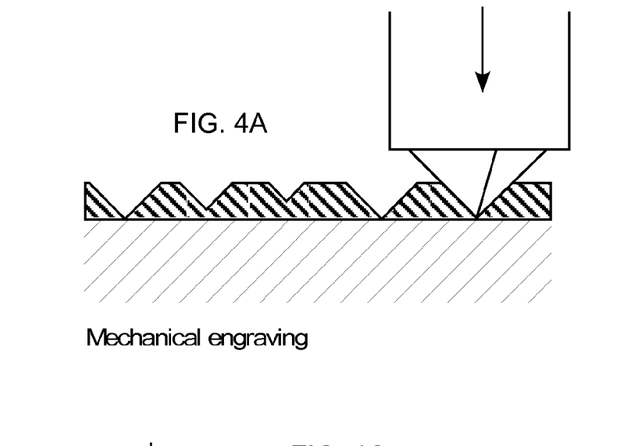
FIGS. 4A-D show example methods to form fiducials
Figure 4B:
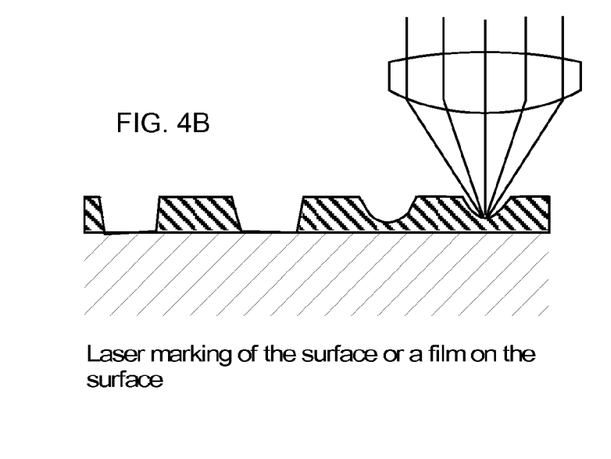
Figure 4C:
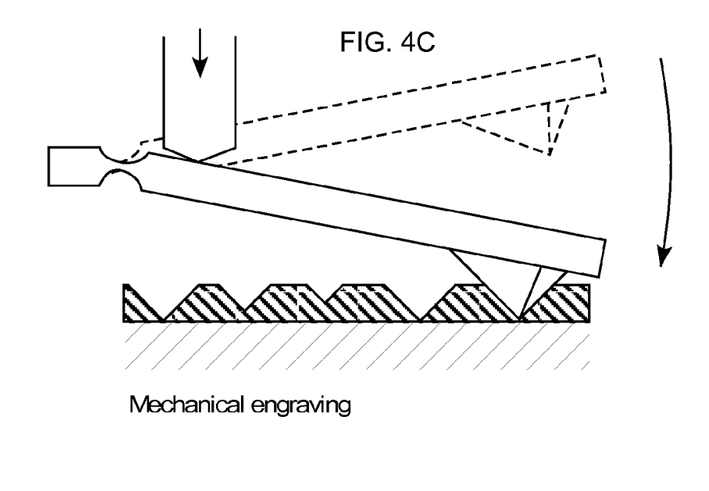
Figure 4D:
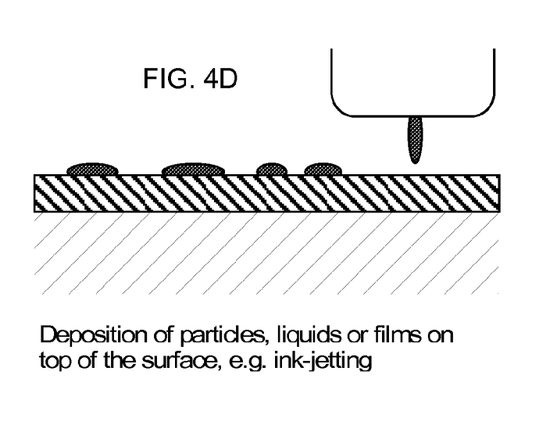

FIGS. 4A-D show several methods to form fiducials which are optically visible without chemical processing. FIG. 4A illustrates use of a ram that strikes perpendicular to the substrate. An impulse, such as spring or a piezo electric actuator presses a point down through the radiation sensitive layer. FIG. 4B illustrates an alternative mechanical apparatus in which a ram strikes an arm causing a tip to press down through the radiation sensitive layer. Mechanical indentation as in FIG. 4A and FIG. 4B using a sharp diamond pyramid similar to a Rockwell hardness tester makes a mark in the photoresist which can be easily seen with an optical sensor. FIG. 4C illustrates use of laser ashing, etching or ablation or other laser marking of the first pattern transfer layer or an exposure sensitive layer. FIG. 4D illustrates deposition of particles, liquids or films on a surface using a process such as ink jetting. For redundancy and error averaging a fiducial can consist of a number of indentation marks as shown in FIGS. 6A-D, e.g. less than 10, less than 100, more than 5, more than 20. The optical sensor can be a camera, a microscope, a line scan camera or the reflection of a writing beam in the optical writer.

The technology disclosed further includes methods and writing systems for forming, by dry methods, optically visible fiducials in an exposure sensitive layer of the workpiece and measuring their positions on a workpiece. A first exposure pattern is formed either before or after the fiducials are created. The position of the fiducials is re-measured when the workpiece is reloaded for a second exposure. The measured position of the fiducials is use to align the second exposure. Typically, machine errors or biases enter identically in both exposures and do not give rise to overlay errors or misalignment. . If there is a constant position error between measuring and writing, e.g. a position offset, this error goes into the overlay error between the layers in the prior used method. In the technology disclosed, the constant error goes identically into both writing operations, thereby reducing differential errors. If there is a non-constant error it is also reduced since the procedure to measure fiducials and write is identical in both layers, which minimizes the differential influence of thermal drift, memory effects, and similar systematic but unknown effects.

Figure 5:
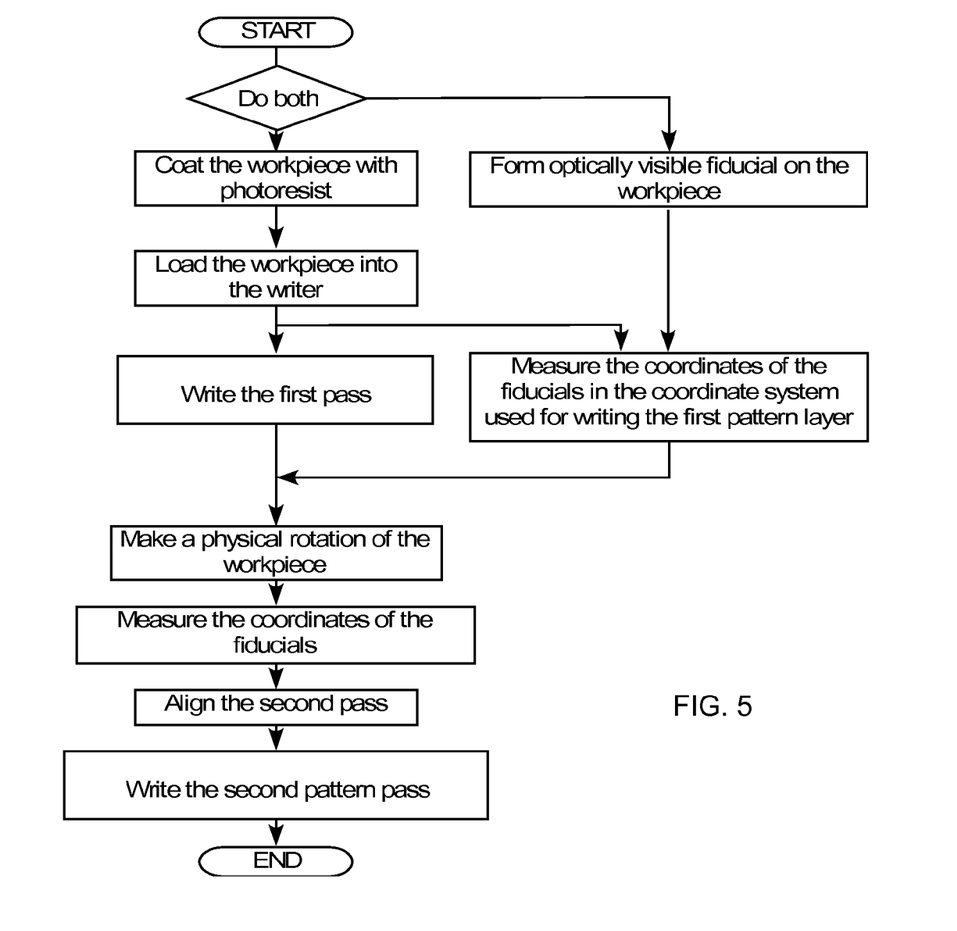
FIG. 5 shows a flowchart of an example procedure for the technology disclosed.
Figure 6A:
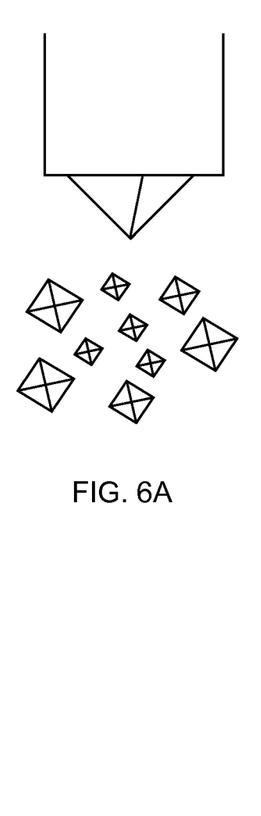
FIGS. 6A-D show examples of mechanical indentations which can be used for alignment
Figure 6B:
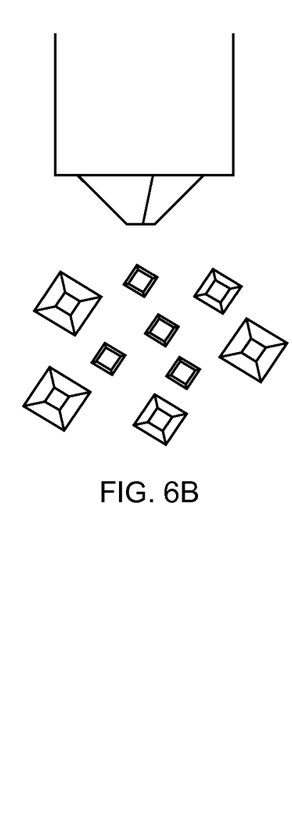
Figure 6C:
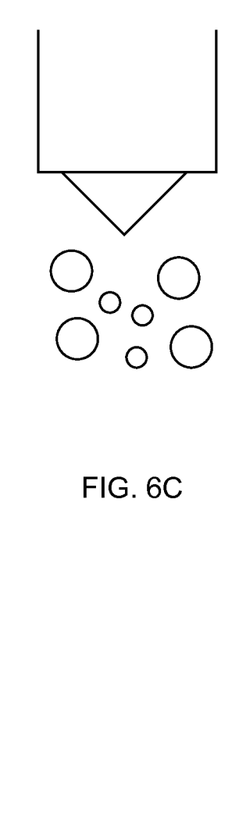
Figure 6D:
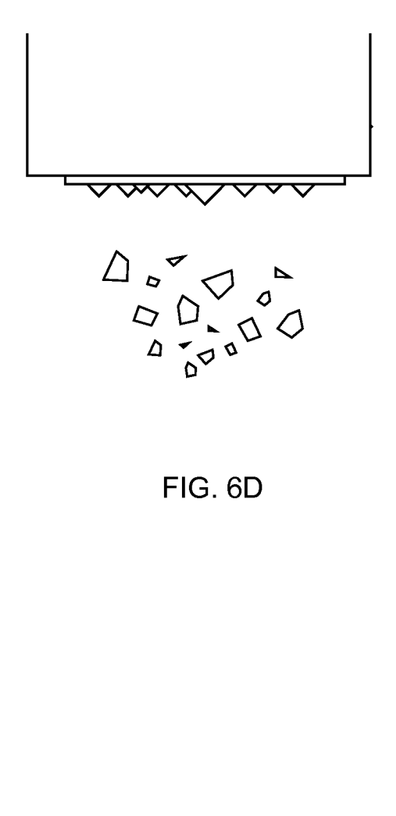

FIG. 5 shows a high level flow chart of example processes. In the top half of the flow chart, parallel paths preceded by "do both" indicate steps that can be performed in various orders. As explained above, optically visible fiducials can be formed before or after loading a workpiece into a writing system and writing the first pattern layer. Whatever the order of the steps, the position of the fiducials is recorded in the same coordinate system as used to write the first exposure. It is important to understand that the fiducials do not need to be formed with any geometrical precision, since they do not define the first coordinate system. The first coordinate system is defined by the precision stage and stage metrology of the writing system. The fiducials are used to transfer the position of the first coordinate system from the first writing operation to the second writing operation, so that the second coordinate system can be accurately positioned relative to the first coordinate system. The first and second coordinate system may be aligned to give a relative translation or rotation with high precision. Furthermore, when the positions of the fiducials are known in the first coordinate system the second coordinate system, which is generally defined by the stage metrology, can be fine adjusted for scale, orthogonality, and keystone and other distortions, so that it not only coincides with the first coordinate system, but becomes identical to it with high precision. This is the meaning of "Aligning the second pass" in FIG. 5.

Particular Implementations

In one implementation, a method is described for writing a pattern according to an input pattern specification with repeated features on a large area photomask or a camera detector photomask with suppressed mura errors. This method includes providing a stage and a writing head with x-y Cartesian relative movement, the x-y movements being essentially perpendicular. The writing head has primary and secondary axes oriented essentially parallel and perpendicular to x-y movements. The method includes loading a photomask substrate at a first rotation angle larger than 5 degrees to the x-y relative movements and exposing a first pattern in a first pass, physically rotating the photomask substrate to a second rotation angle at least 10 degrees from the first rotation angle, and exposing a second pass with a second pattern in a second pass. Practicing this method, the first and second pattern can be based on the same input pattern specification, accurately overlaid between the exposure passes. The first and second exposures can be written without development of an exposure sensitive layer on the workpiece.

This method and other implementations the technology disclosed can each optionally include one or more the following features. The angle between the passes can be larger than 40 degrees. The angle between the passes can be approximately 60 degrees. The angle between the passes can be larger than 70 degrees. The angle between the passes can be approximately 90 degrees.

The writing head can be a multibeam acoustooptic scanner, a multibeam polygon scanner, a one-dimensional spatial modulator, or other writing head.

The substrate can have a photoresist film with alignment fiducials formed in or on the photoresist layer and used for aligning the first and second passes. The fiducials can be formed by mechanical indentation. They can be formed by laser radiation or formed by deposition of a substance on the surface of the photomask substrate or photoresist film.

One implementation of the technology disclosed is a method of aligning a workpiece between two exposure patterning operations. This method includes forming fiducials by a dry method in or on an exposure sensitive layer on a workpiece. It further includes measuring and recording first position information of the fiducials in a first coordinate system used by a writing system to apply a first exposure to the workpiece. In conjunction with this method, the workpiece is physically moved and repositioned in the writing system, which requires further alignment. The alignment consists rotating the second coordinate system based on the second position information, and may optionally also involve fine correction of scale, orthogonality, keystone and other distortions. The method optionally includes applying a second exposure to the workpiece using the second coordinate system.

This method and any of the following variations can be extended by processing exposed patterns on the workpiece to produce electronic structures of a flat-panel display. These electronic structures may be, without limitation, light emitting diodes, plasma cells, or a liquid crystal shutters. They also may be filters or control components.

The foregoing methods can be combined with one or more the following features. In some implementations, the dry method forms the fiducials in a polymer layer of photoresist.

When the workplace is replaced in the writing system, it is rotated between writing of two exposures of the exposure sensitive layer.

Applying this method, the measuring and recording position information can share optical components with the writing of the exposures to the exposure sensitive layer(s).

This system can be combined with one or more of the following features. In one implementation, the dry fiducial forming station can physically modify a polymer layer of photoresist. It can include a point and a ram that form the fiducials by mechanical indentation. The mechanical indentation can expose a first patterning layer on the workpiece through the exposure sensitive layer. Or, the mechanical indentation can at least partially penetrate a first patterning layer on the workpiece underlying the exposure sensitive layer.

In some implementations, the dry fiducial forming station includes a writing head that deposits material on the exposure sensitive layer.

In some implementations, the dry fiducial forming station includes a laser and optics that ash or ablate the exposure sensitive layer.

The system optics, detector and location processor can further estimate a rotation of the workpiece between the writing of two exposures of the exposure sensitive layer. Or, they can estimate a rotation of the workpiece between the writing of exposures to two different exposure sensitive layers on the workpiece.

The optics used with the detector and the location processor may also be used by writing system to apply the exposures to the exposure sensitive layer(s).

While the technology disclosed is disclosed by reference to the embodiments and examples detailed above, it is understood that these examples are intended in an illustrative rather than in a limiting sense. Computer-assisted processing is implicated in the described implementations. It is contemplated that modifications and combinations will readily occur to those skilled in the art, which modifications and combinations will be within the spirit of the technology disclosed and the scope of the following claims.

I claim as follows:

1. A method for writing a pattern according to an input pattern specification with repeated features on a large area photomask or a camera detector photomask with suppressed mura errors, comprising:
   providing a stage and a writing head with x-y relative movements, the x relative movements being essentially perpendicular to the y relative movements,
   said writing head having a primary axis and a secondary axis essentially aligned with the x-y relative movements,
   loading a photomask substrate at a first rotation angle larger than 5 degrees to the x-y relative movements and exposing a first pattern in a first pass,
   physically rotating the photomask substrate to a second rotation angle at least 10 degrees from the first rotation angle and exposing a second pattern in a second pass,
   wherein the first and second patterns are based on the same input pattern specification and are aligned in the first and second passes.

2. The method of claim 1, wherein the first and second rotation angles are essentially symmetrical to one of the x relative movement or y relevant movement.

3. The method of claim 1, wherein the angle between the first and second rotation angles is larger than 40 degrees.

4. The method of claim 1, wherein the angle between the first and second rotation angles is approximately 60 degrees.

5. The method of claim 1, wherein the angle between the first and second rotation angles is larger than 70 degrees.

6. The method of claim 1, wherein the angle between the first and second rotation angles is approximately 90 degrees.

7. The method of claim 1, wherein the writing head is a multibeam acoustooptic scanner.

8. The method of claim 1, wherein the writing head is a multibeam polygon scanner.

9. The method of claim 1, wherein the writing head is a one-dimensional spatial modulator.

10. The method of claim 1, wherein the substrate has a photoresist film and alignment fiducials are formed in or on the photoresist layer and used for aligning the first and second passes.

11. The method of claim 10, wherein the fiducials are formed by mechanical indentation.

12. The method of claim 10, wherein the fiducials are formed by laser radiation.

13. The method of claim 10, wherein the fiducials are formed by deposition of a substance on the surface of the photomask substrate or photoresist film.

14. A method for writing a pattern according to an input pattern specification with repeated features on a large area photomask or a camera detector photomask with suppressed mura errors, comprising:
    providing a stage and a writing head with relative movement in at least a first direction,
    loading a photomask substrate at a first position on the stage and exposing a first pattern in a first pass, and
    physically rotating the photomask substrate to a second position on the stage, wherein the photomask substrate at the second position is oriented at least 10 degrees from the first position, and exposing a second pattern in a second pass,
    wherein the first and second patterns are based on the same input pattern specification and are aligned in the first and second passes.

15. The method of claim 14, wherein the angle between the first and second positions is larger than 40 degrees.

16. The method of claim 14, wherein the angle between the first and second positions is approximately 60 degrees.

17. The method of claim 14, wherein the angle between the first and second positions is larger than 70 degrees 18. The method of claim 14, wherein the angle between the first and second rotation angles is approximately 90 degrees.

19. The method of claim 14, wherein the substrate has a photoresist film and alignment fiducials are formed in or on the photoresist layer and used for aligning the first and second passes.

* * * * *